United States Patent
Yoshikawa et al.

(10) Patent No.: US 6,856,005 B2
(45) Date of Patent: Feb. 15, 2005

(54) SEMICONDUCTOR DEVICE HAVING A NITRIDE-BASED HETERO-STRUCTURE AND METHOD OF MANUFACTURING THE SAME

(75) Inventors: Akihiko Yoshikawa, Chiba (JP); Ke Xu, Chiba (JP)

(73) Assignee: Chiba University, Chiba (JP)

( * ) Notice: Subject to any disclaimer, the term of this patent is extended or adjusted under 35 U.S.C. 154(b) by 0 days.

(21) Appl. No.: 10/667,333

(22) Filed: Sep. 23, 2003

(65) Prior Publication Data
US 2004/0108500 A1 Jun. 10, 2004

(30) Foreign Application Priority Data

Sep. 25, 2002 (JP) ..................................... 2002-280082
Sep. 5, 2003 (JP) ..................................... 2003-314057

(51) Int. Cl.$^7$ ............................................. H01L 29/20
(52) U.S. Cl. ..................... 257/615; 257/613; 257/76; 438/604
(58) Field of Search ................................. 257/615, 613, 257/76; 438/604

(56) References Cited

U.S. PATENT DOCUMENTS 6,350,666 B2 * 2/2002 Kryliouk .................... 438/604

* cited by examiner

Primary Examiner—Luan Thai
(74) Attorney, Agent, or Firm—Oliff & Berridge, PLC

(57) ABSTRACT

The object of the invention is to provide a semiconductor device having a nitride-based hetero-structure in which an epitaxial nitride film has a uniformly flat surface at a single molecule level, and a method of easily fabricating such a device. The object of the invention is achieved by providing a semiconductor device comprising a sapphire substrate whose c-surface is modified to be nitride-surfaced, GaN buffer layer, N polarity GaN layer, N polarity AlN layer, N polarity InN/InGaN multi-layered device structure, Al polarity AlN layer, and GaN cap layer.

2 Claims, 13 Drawing Sheets

FIG. 7A
FIG. 7B
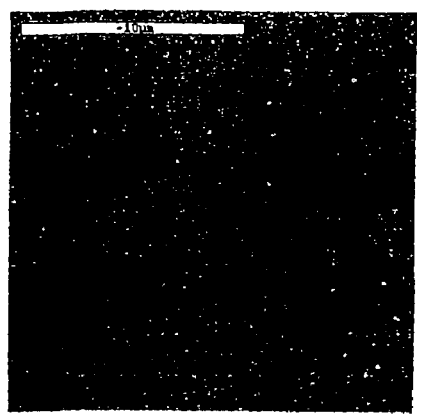

SEMICONDUCTOR DEVICE HAVING A NITRIDE-BASED HETERO-STRUCTURE AND METHOD OF MANUFACTURING THE SAME

BACKGROUND OF THE INVENTION

1. Field of the Invention

The present invention relates to optically and/or electronically active and/or passive semiconductor devices having a nitride-based hetero-structure mainly composed of InN or InN-based compounds (e.g., semiconductor laser diodes/light emitting diodes which have an excellent temperature characteristic to be used as a light source in optical communication, ultra-high speed optical control devices/optical modulators capable of working in a femto second range, resonant tunnel diodes, ultra-high speed and ultra-high power and ultra-high power saving electronic devices, etc.), and to a method of manufacturing the same. The term "a compound mainly composed of InN" used herein refers to an InN-based compound which contains InN at 50% or more. The term "nitrogen (N) polarity surface or a surface equivalent to that surface" used herein refers to a polarized surface such as (001) or (101) plane having N polarity, and surfaces tilted 10 degrees or less from that surface.

2. Description of the Related Art

Nitride semiconductors mainly composed of gallium nitride (GaN) can be used as a material of UV and visible light emitting elements and ultra-high speed electronic devices. According to recent studies, it was found that indium nitride (InN) has an energy band-gap of about 0.7 eV or a value considerably lower than the hitherto reported one. From this it was suggested that InN-containing nitride semiconductors could cover a considerably wide energy band-gap range whose lower limit reaches as low as 0.7 eV. Further, the difference in the energy band-gap between InN and GaN becomes very large, resulting in such a large conduction band offset as about 2 eV similar to the case in that between GaN and AlN. From this it is expected that nitrides semiconductor based hetero-structure devices mainly composed of InN or an InN-based compound will be stable over a considerably wide temperature range, and thus they will be profitably used as a material of basic optical/electronic devices to support ultra-high speed and ultra-broad bandwidth optical communication expected to be introduced in the near future for transmitting a huge amount of visual information, for example, as a light source to support such optical communication, or as a power amplifier to amplify signals at a relay station of a network involved in such optical communication.

Aluminum nitride (AlN), gallium nitride (GaN) and indium nitride (InN)-based nitride semiconductors have a hexagonal crystal structure. As for many hetero-structure devices obtained by depositing such semiconductors on a sapphire or silicon carbide (SiC) substrate, the c-axis of the crystal is essentially normal to the surface of the substrate. When epitaxy is used for growing AlN or GaN crystal, it is preferably carried out in such a manner as to allow the crystal to grow along the c-axis to exhibit cation elements such as Al or Ga on the surface of growing crystal (+c polarity). However, what effect the polarity of crystal mainly composed of InN or an InN-based compounds has on the epitaxy itself and the quality of the epitaxial film still remains unclear. Generally, however, it has been believed that nitride semiconductor materials, similarly to those composed of GaN, having +c polarity are preferable. For details in this point, see, for example, the following non-patent documents: Y. Sato et al., "Polarity of high quality indium nitride grown by RF molecular beam epitaxy," Phys. Stat. Sol., (b) 228, No. 1, (2001), pp. 13–16, and A. Yoshikawa, et al., "In situ investigation for polarity-controlled epitaxy processes of GaN and AlN in MBE and MOVPE growth," Optical Materials 23, (2003), pp. 7–14.

The crystal growth (hetero-epitaxy) itself of a compound semiconductor material mainly composed of InN or an InN-based compound is extremely difficult because the equilibrium vapor pressure of InN is very high. For the resulting epitaxial film to be suitably used as a material of optical devices for optical communication or of high-speed and high-power and high power saving electronic devices, it must have an ultra-thin thickness and ultra-abrupt hetero-structural interfaces. However, it is difficult at present to obtain epitaxial films of InN or InN-based compounds which are atomically flat as is achieved by a so-called step flow growth process for other semiconductor materials. Moreover, the crystal quality of an epitaxial film obtained by a conventional process is poor and not enough for device applications. Thus, the conventional epitaxy process must be significantly improved so as to produce an epitaxy film from InN or an InN based compound exhibiting a satisfactory crystal quality.

DISCLOSURE OF THE INVENTION

An object of the invention is to provide a semiconductor device having a nitride-based hetero-structure mainly composed of InN or InN-based compounds where nitride epitaxial films are uniformly flat at a mono-layer level, and a method for easily fabricating such a device, the method being characterized by paying attention to the effect of polarity of growing crystals on the epitaxy itself as well as the performance of the device.

Another object of the invention is to provide a method of manufacturing a high quality nitride-based epitaxial film and for fabricating a hetero-structural device incorporating such a film, the method being characterized by forming an epitaxial film at higher temperatures than used in conventional epitaxy.

Another object of the invention is to provide a method for rapidly forming a nitride film and hetero-junction structure incorporating such a film, and for fabricating such devices on enlarged substrate.

A semiconductor device having a nitride-based hetero-structure according to the invention has a nitride-based hetero-structure mainly composed of InN or an InN-based compound in which the crystal has, at least partly, an N polarity surface or surfaces equivalent to that surface.

A method of manufacturing a semiconductor device having a nitride-based hetero-structure is characterized by forming, in the device, a nitride-based hetero-structure mainly composed of InN or InN-based compounds in which the crystal has, at least partly, an N polarity surface or a surface equivalent to that surface.

The present invention allows an epitaxial film or crystalline semiconductor material to be formed in which the crystal has, at least partly, an N polarity surface or a surface equivalent to that surface (e.g., surface tilted 10° or less from that surface). Because of this, even when epitaxy is performed in an atmosphere enriched with an excess amount of nitrogen, it is possible to carry out epitaxy at a high temperature, and to produce a film having an atomically flat surface as is achieved by the two dimensional step flow process. Briefly, according to the invention, it is possible to provide a semiconductor device having a nitride-based hetero-structures in which an epitaxial layer has a uniformly flat surface at a mono-layer level which leads to the improved quality of the device, and a method enabling the easy fabrication of such a device. It should be noted in this connection that the formation of an epitaxial film composed of InN or an InN-based compound is very difficult and has never been amenable to conventional two dimensional step flow processes, except for the method of the present invention.

BRIEF DESCRIPTION OF THE DRAWINGS

FIG. 7A is a photograph of the surface of an InN epitaxial film taken by scanning electronmicroscopy, and FIG. 7B is a photograph of the surface of an InN epitaxial film taken by atomic force microscopy.

DESCRIPTION OF THE PREFERRED EMBODIMENTS

Semiconductor devices having a nitride-based hetero-structure representing the preferred embodiments of the invention and methods for fabricating such devices will be described in detail below with reference to the attached drawings.

Figure 1:
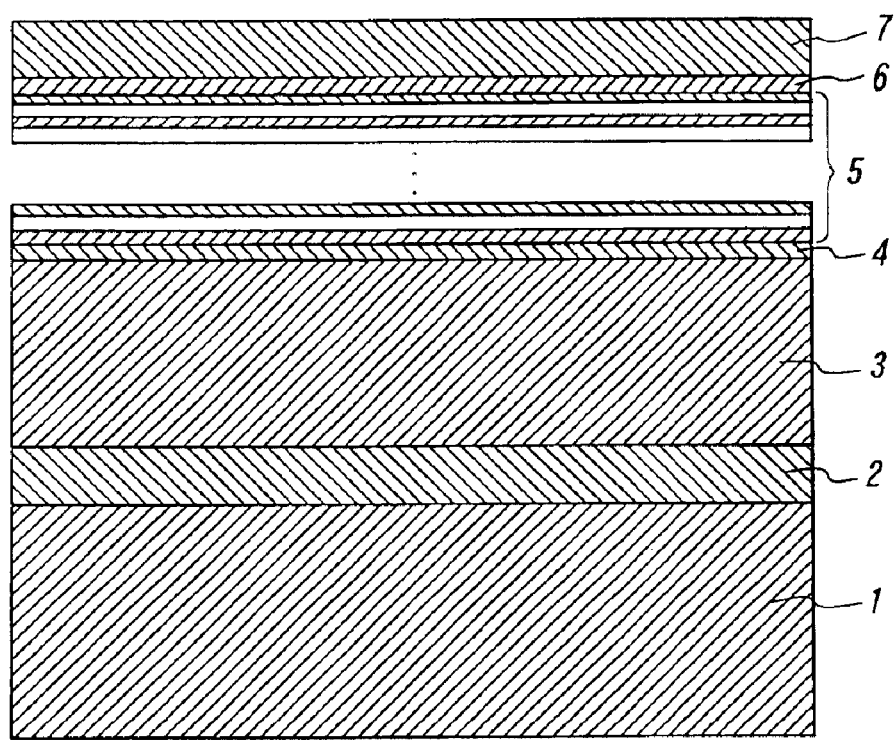
FIG. 1 is a cross sectional view of a semiconductor device of the invention which has nitride-based hetero-structures.

FIG. 1 is a cross sectional view of a semiconductor device of the invention which has nitride-based hetero-structures. The semiconductor device illustrated here comprises a sapphire substrate 1 whose c-surface is nitrided, buffer layer 2 constituted with GaN, InN or a quaternary compound such as AlGaInN, N polarity GaN layer 3, N polarity AlN layer 4, N polarity InN/InGaN multi-layered device structure 5, Al polarity AlN layer 6, and GaN cap layer 7.

Figure 2:
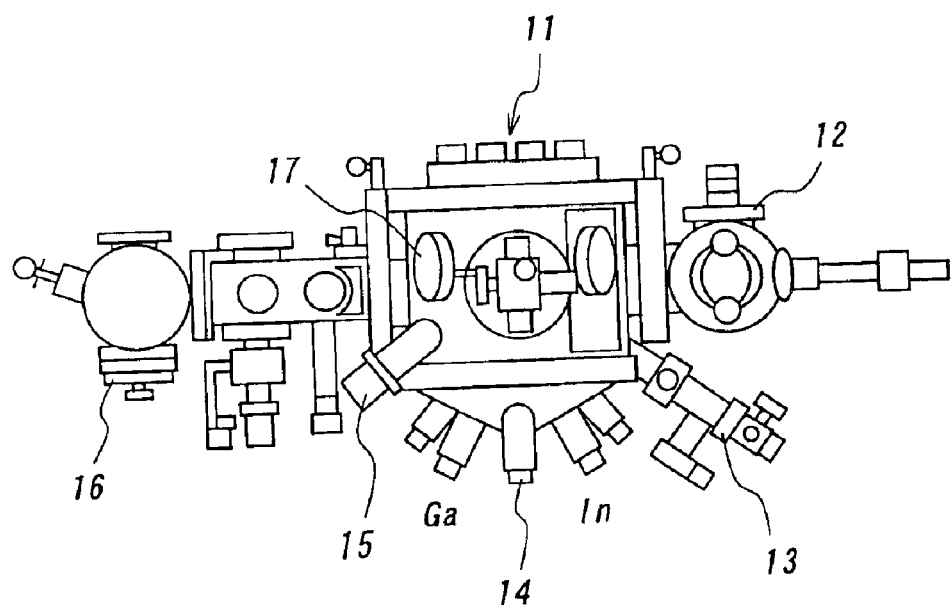
FIG. 2 is an epitaxy system for fabricating a semiconductor device of the invention which has nitride-based hetero-structures.
Figure 3:
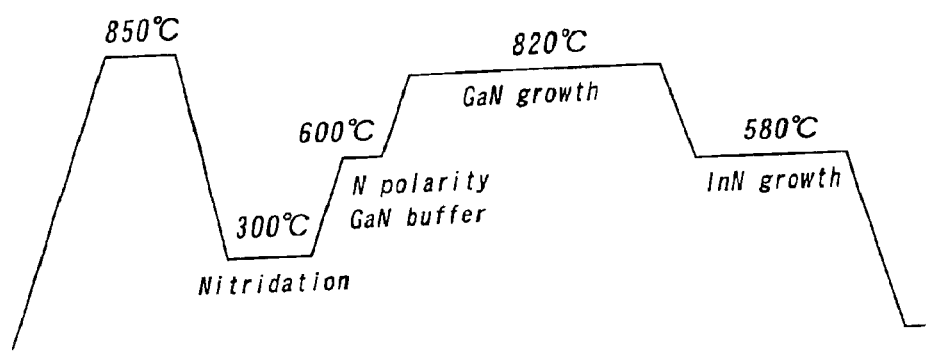
FIG. 3 shows an exemplary growth sequence of InN on an N polarity GaN template.

FIG. 2 is an epitaxy system for producing a semiconductor device of the invention which has nitride-based hetero-structures. FIG. 3 shows an exemplary growth sequence of InN on an N polarity GaN template. The epitaxy system illustrated in FIG. 2 comprises a main chamber 11, load lock chamber 12, co-axial impact collision ion scattering spectroscopy (CAICISS) 13, RF plasma cell 14 for supplying nitrogen, spectroscopic ellipsometer (SE) 15, ultrahigh-vacuum scanning tunneling microscope/atomic force microscope 16, and reflection high energy electron beam diffraction meter 17.

Figure 4:
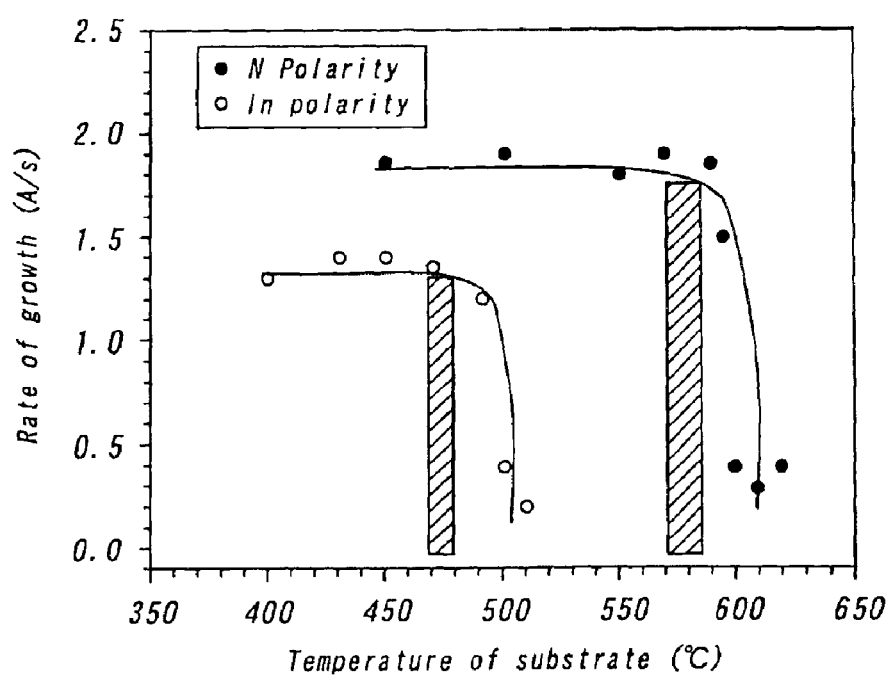
FIG. 4 compares the two cases of InN crystal growth, one for In polarity growth and the other for N polarity growth in terms of the dependency of InN film formation on the ambient temperature, while other conditions are kept unchanged, where molecular beams are adjusted in both cases such that the supply of N slightly exceeds that of In from a stoicheometric consideration.

FIG. 4 compares the two cases of InN crystal growth, one for In polarity growth and the other for N polarity growth in terms of the dependency of InN film formation on the ambient temperature, while other conditions are kept unchanged, where molecular beams are adjusted in both cases such that the supply of N slightly exceeds that of In from a stoicheometric consideration. The temperature range over which the rate of film formation drops sharply with the increase of temperature is marked by a hatched long band for either case. These bands indicate the best temperature range for epitaxy for the respective cases. The best temperature range for the formation of an N polarity InN film is about 100° C. higher than the counterpart for the formation of an In polarity InN film. Once droplets of In appear on the surface of growing InN crystal, they interfere with the growth of the InN crystal. Thus, it is necessary to minimize the development of In droplets on the surface of growing InN crystal during formation of the epitaxial film. When InN is grown to have N polarity, film formation can occur at higher temperatures than in the case where InN is grown to have In polarity, which makes N polarity InN more advantageous because the high temperature is effective for suppressing the formation of In droplets. Moreover, the high temperature stimulates the surface migration of adatoms responsible for the formation of InN film which will contribute to the uniform formation of the high quality film. True, regardless of whether InN is grown to take N or In polarity, it is possible to elevate the highest temperature level compatible with epitaxy by increasing the overall supplies of source elements. Even in that case, the precedence of N polarity InN over In polarity InN is invariable.

Figure 5:
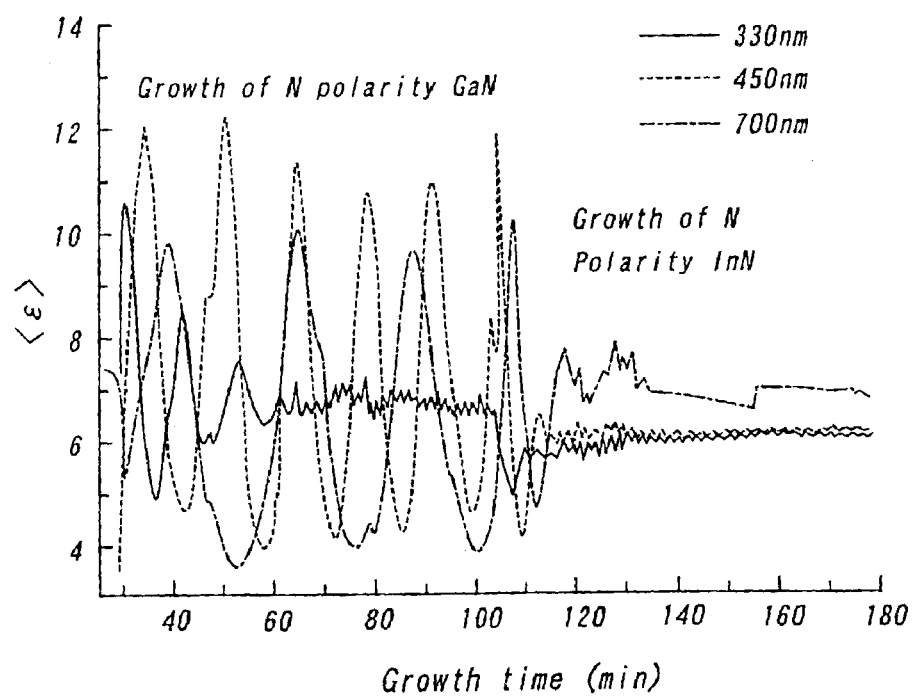
FIG. 5 shows the results of in-situ observation of InN growth on GaN achieved by spectroscopic ellipsometry (SE).
Figure 6:
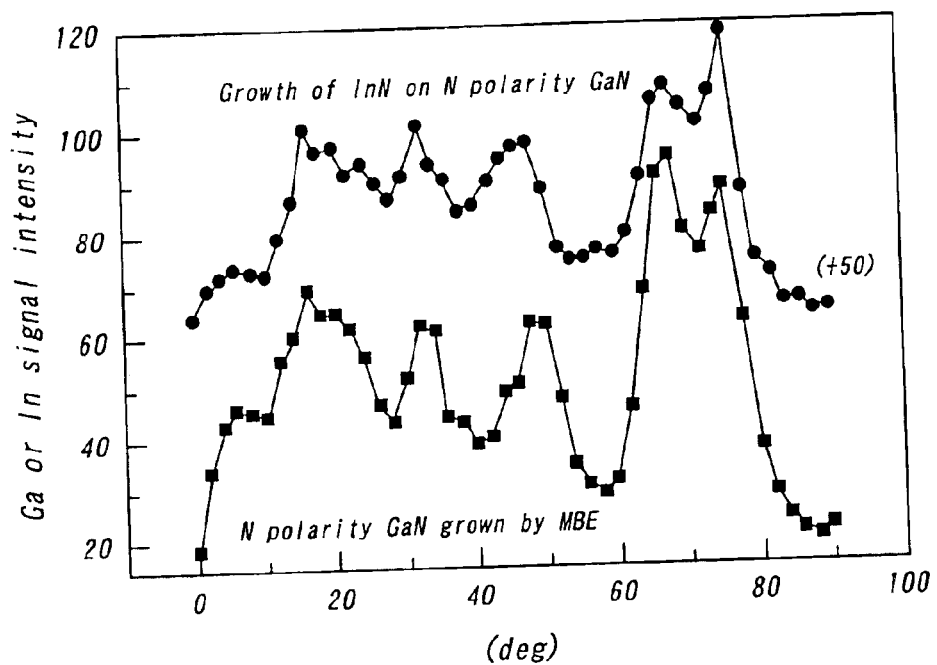
FIG. 6 shows the polarity of InN analyzed by co-axial impact-collision ion scattering spectroscopy (CAICISS).

FIG. 5 shows the results of in-situ observation of InN growth on GaN achieved by spectroscopic ellipsometry (SE). FIG. 6 shows the polarity of InN analyzed by CAICISS. FIG. 6 shows both the GaN substrate and InN epitaxial film have N polarity.

FIG. 7A is a photograph of the surface of an InN epitaxial film taken by scanning electronmicroscopy, and FIG. 7B is a photograph of the surface of an InN epitaxial film taken by atomic force microscopy. Both figures show that the InN epitaxial film has a very smooth, flat surface thanks to the two-dimensional step flow growing process employed for the formation of the film.

Figure 8A:
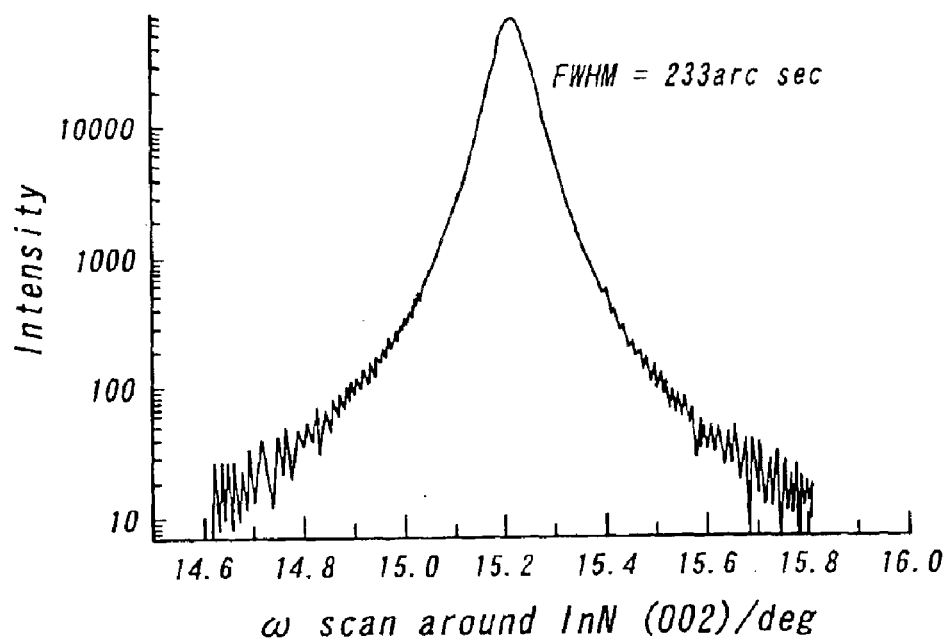
FIG. 8 shows the evaluation of an InN epitaxial film based on its X-ray diffraction analysis: the full width at the half maximum of the rocking curve is 233 and 970 arc sec for (002) and (102) surfaces, respectively, and the electron mobility is 2000 cm$^2$/V.sec or a considerably high value.
Figure 8B:
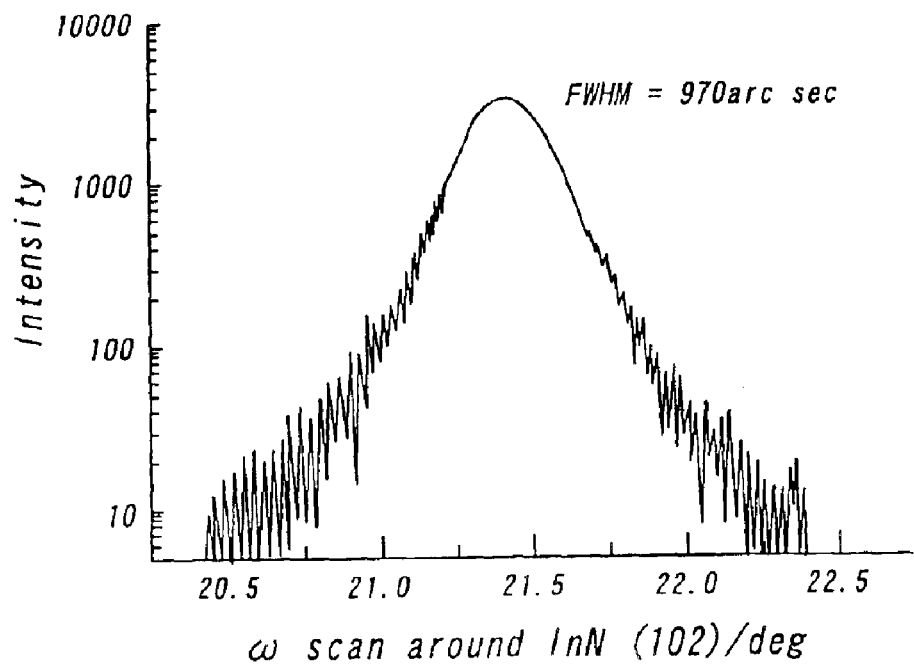

FIG. 8 shows the evaluation of an InN epitaxial film based on its X-ray diffraction analysis: the full width at the half maximum of the rocking curve is 233 and 970 arc sec for (002) and (102) surfaces, respectively, and the electron mobility is 2000 cm$^2$/V.sec or a considerably high value.

According to the invention, it is possible to fabricate an InN-based nitride semiconductor device much more easily as described above or a high quality hetero-junction device with abrupt hetero-interfaces incorporating ultra-thin InN films by molecular beam epitaxy (MBE) than is possible with conventional techniques, the method being characterized by adjusting the condition of film formation such that the surface of growing InN crystal or a surface equivalent thereto takes N polarity.

Figure 9:
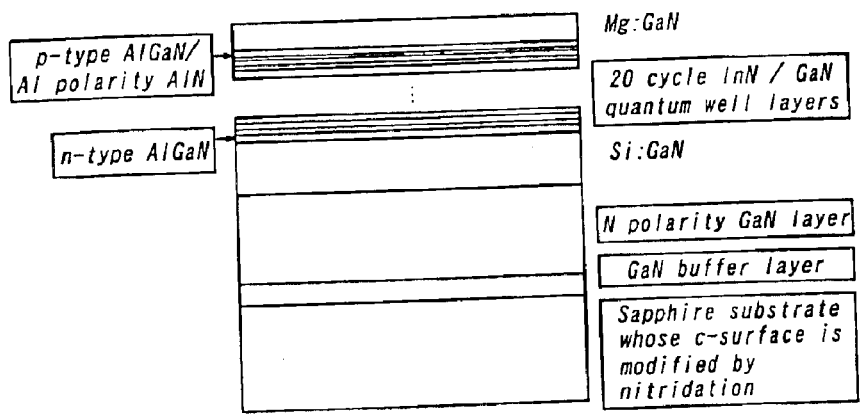
FIG. 9 shows the constitution of a semiconductor device representing a first embodiment of the invention.

FIG. 9 shows the constitution of a semiconductor device representing a first embodiment of the invention. The device takes the form of a general quantum hetero-structure laser diode. However, it may serve as a light emitting diode. This device has features as described in the following paragraphs (1) to (5).

(1) The c-surface of a sapphire substrate is nitrided or turned into N polarity AlN on which an N polarity GaN buffer layer and N polarity GaN basement layer are deposited.

(2) AlGaN layer which serves as a barrier to confine carriers (this layer consists of an AlGaInN layer having an arbitrary composite ratio so that it has a wider energy band-gap than does the active layer).

(3) The active layer includes N polarity InN/InGaN quantum well layers. Although the active layer mainly consists of InN/InGaN quantum well layers, it is also possible to contain well layers composed of InGaN layers and barrier layers composed of AlGaInN layers. The compositions of the well layer and barrier layer are determined by the wavelength of light to be emitted. Both the quantum well layer and barrier layer may have a thickness also appropriate to the wavelength of light to be emitted, which generally ranges from the thickness of a single mono layer to 10 nm. The repetition cycle of quantum wells is 1 to 20. The wavelength of light to be emitted is 0.8 to 1.8 µm.

(4) In order to assume the formation of GaN and AlGaN films following deposition of the active layer occurs in +c polarity (that is, Al, Ga or In polarity or cation element polarity), deposition of the active layer is followed by deposition of a polarity reversed AlN layer (N polarity growth is reversed into Al polarity growth during the deposition of the AlN layer). This layer is introduced to support the atomically flat film formation and increased doping efficiency in the successive formation of a p-type AlGaN layer and GaN layer. However, introduction of this layer is not always necessary, because the same film formation in −c polarity (N polarity or anion element polarity) may serve for the purpose as well.

(5) The device includes a highly doped p-type GaN layer with Ga polarity and a p-type contact on its surface.

Figure 10:
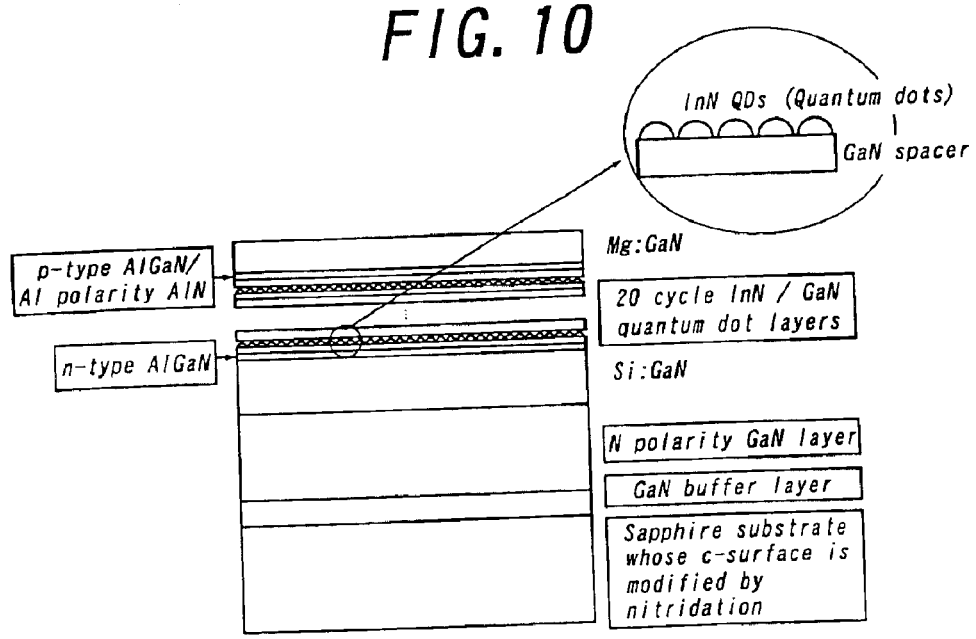
FIG. 10 shows the constitution of a semiconductor device representing a second embodiment of the invention.

FIG. 10 shows the constitution of a semiconductor device representing a second embodiment of the invention. The device takes the form of a laser diode containing quantum dots in the active layer, but may also serve as a light emitting diode. This device has features as described in the following paragraphs (1) to (3).

(1) The active layer consists of InN/GaN super-lattice layers comprising InN quantum dots. The quantum dots together with barrier layers of the active layer and basement layers may be composed of InGaN depending on the wavelength of emitted light. The size of dots and thickness of each layer are adjusted to fall within the range of several nm to 10 nm.

(2) The active layer has, on both upper and lower ends, AlGaN layers which serve as barriers to confine carriers.

(3) The concept for designing the device of this embodiment is the same as in the embodiment shown in FIG. 9, except that in this embodiment the active layer consists of InN/GaN super-lattice layers comprising InN quantum dots.

Figure 11:
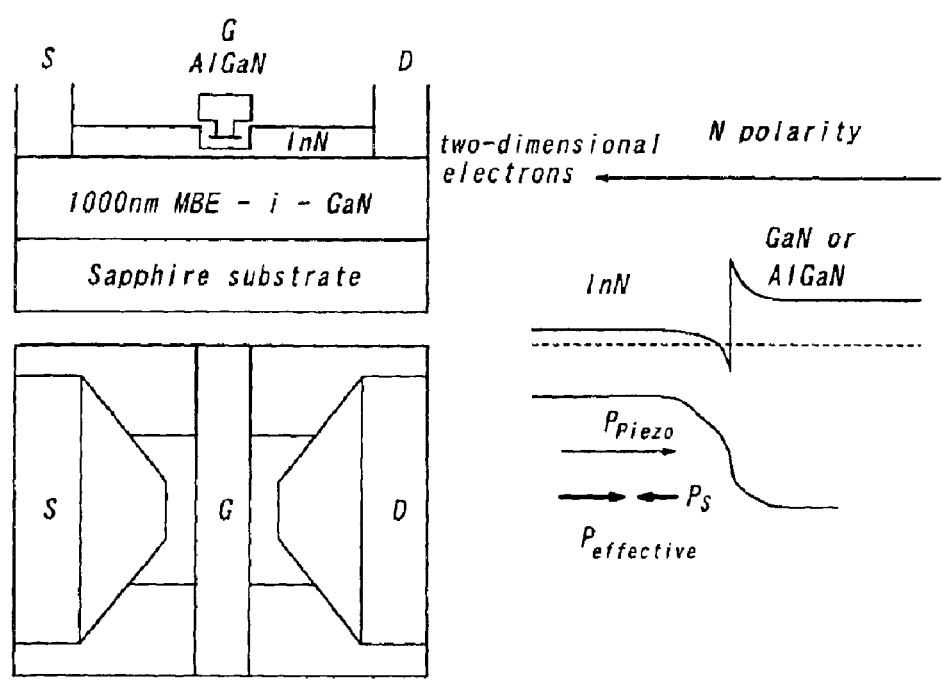
FIG. 11 shows the constitution of a semiconductor device representing a third embodiment of the invention.

FIG. 11 shows the constitution of a semiconductor device representing a third embodiment of the invention. This device takes the form of an InN-based high electron mobility transistor (HEMT). This device has features as described in the following paragraphs (1) to (3).

(1) The device has a HEMT structure based on a two-dimensional electron gas layer generated as a result of piezo-electric effect developed at a hetero-interface between a high resistance N polarity GaN and an overlying InN/GaN layer (or InGaN/AlGaN).

(2) The gate electrode has a thin, high resistance AlGaN layer beneath it which serves as a gate insulating film.

(3) It is possible to form a two-dimensional electron layer just beneath the gate insulating film by depositing a very thin Al polarity AlN for polarity inversion prior to the formation of the gate insulating film, which causes the AlGaN layer to have +c polarity, and by appropriately treating strains developed between this layer and the InN layer.

Figure 12:
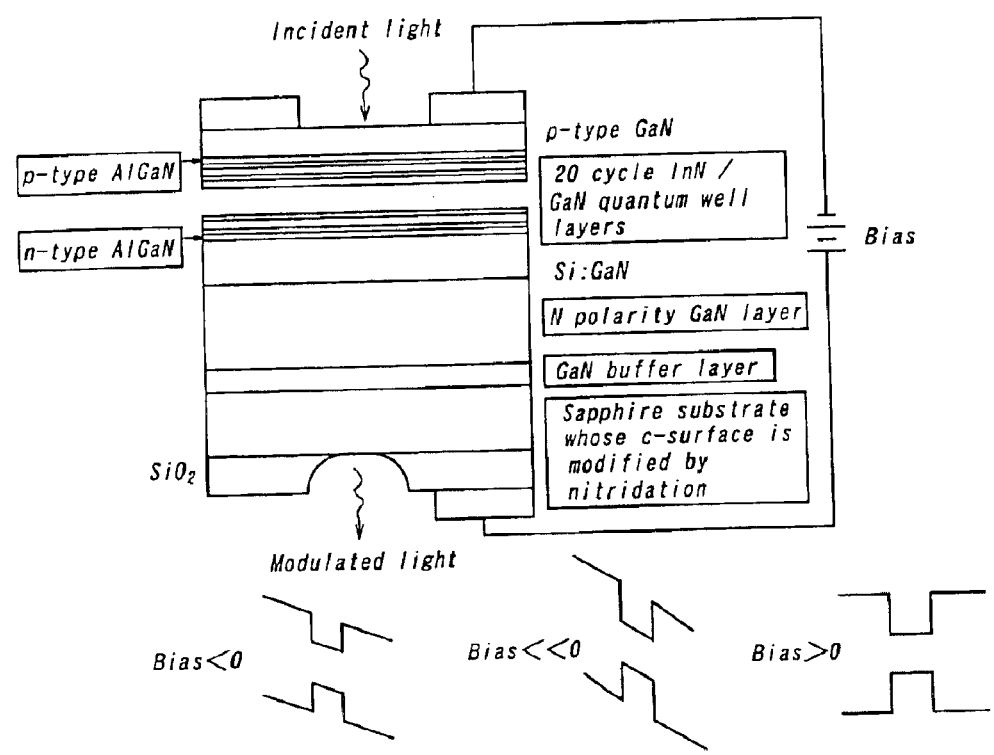
FIG. 12 shows the constitution of a semiconductor device representing a fourth embodiment of the invention.

FIG. 12 shows the constitution of a semiconductor device representing a fourth embodiment of the invention. This device takes the form of an electric field-based photo-modulator. This device has features as described in the following paragraphs (1) to (3).

(1) This device is designed based on the concept used for designing the first embodiment shown in FIG. 9, except for its input and output portions.

(2) Light is modulated via voltage/electric field externally applied.

(3) The direction of incident light and modulated light is in parallel with or normal to the plane of quantum well structure.

Figure 13:
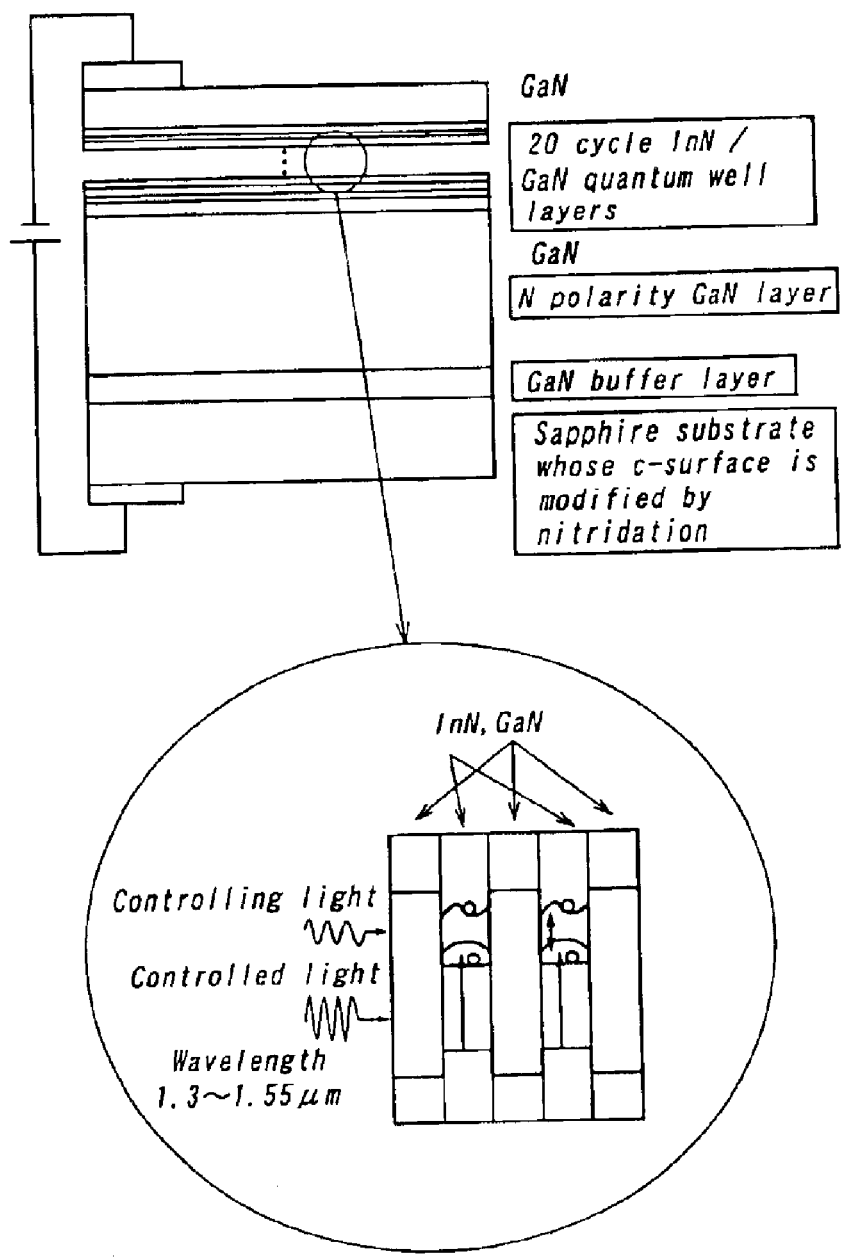
FIG. 13 shows the constitution of a semiconductor device representing a fifth embodiment of the invention.

FIG. 13 shows the constitution of a semiconductor device representing a fifth embodiment of the invention. This device takes the form of an optical or electrical photo-modulator (utilizing electron transition in a band (intraband or inter-subband) or between different bands (interband) within a quantum well). This device has features as described in the following paragraphs (1) to (2).

(1) This device includes InN/GaN quantum wells. For the controlled light (modulated light) to be used as a medium in optical communication, it is possible to stimulate the transition of electrons between sub-bands of a quantum well by means of a controlling light beam (or modulating light beam), to thereby modulate the absorption of the light at a ultra-high speed by the transition of electrons. Alternatively, if the relationship of the controlling light with the modulated light is reversed, the device may be used as another photo-modulator.

(2) The quantum well may be composed of InGaN/AlGaInN. Then, it is possible to alter the wavelength of emitted light over the range of 0.8 to 1.8 µm by changing the thickness of the active layer in the quantum well.

Figure 14:
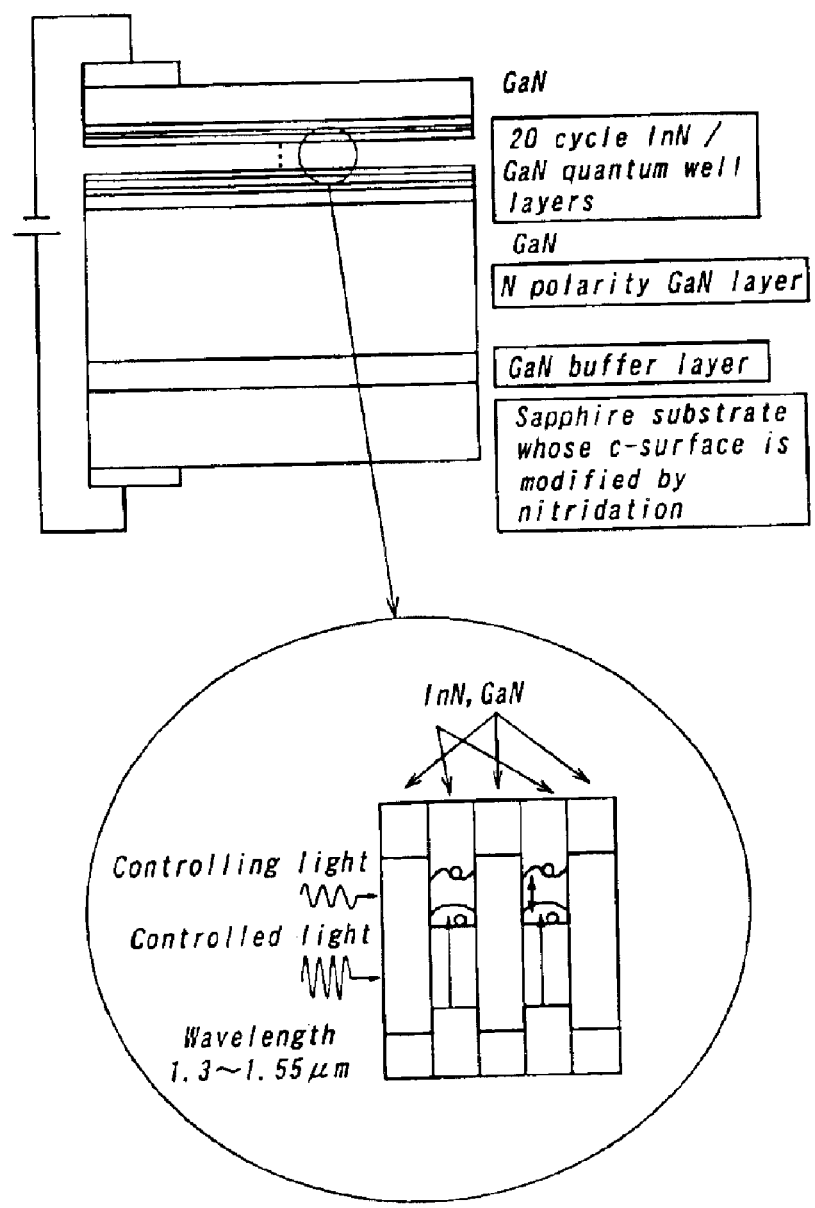
FIG. 14 shows the constitution of a semiconductor device representing a sixth embodiment of the invention.

FIG. 14 shows the constitution of a semiconductor device representing a sixth embodiment of the invention. This device takes the form of an optical or electrical photo-modulator (utilizing electron transition in a band (intraband or inter-subband) or between different bands (interband) within a structure containing an active layer and quantum dots). This device has features as described in the following paragraphs (1) to (2).

(1) This device contains quantum dots in its active layer as distinct from the photo-modulator illustrated in FIG. 13. Thanks to this feature, limitations imposed on the direction of impinging light are eliminated.

(2) This device is designed based on the concept used for designing the fourth embodiment shown in FIG. 12. The relationship of the controlling light with the controlled light, and the wavelength of controlled light can be altered as well.

This invention is not limited to the embodiments cited above, but permits many modifications and variations.

For example, it is possible to confer quantum dots to part of an epitaxial film having N polarity or a film having an equivalent feature, or to part of a semiconductor device (e.g., quantum dot laser diode or the like) by appropriately adjusting the conditions required for the formation of the film or device. In the formation of such a film, or in the fabrication of such a device, the features specified in the invention are necessary for forming hetero-structures having an active layer containing stacked quantum dots layers as well as cladding layers whose quality is sufficiently high to be applied for the fabrication of semiconductor devices. Moreover, it is possible to manufacturing the semiconductor device according to the present invention by means of other technology (e.g. MOVPE) except for the MBE.

What is claimed is:

1. A semiconductor device having a nitride-based hetero-structure mainly composed of InN or an InN-based compound which comprises crystal having, at least partly, a nitrogen polarity surface or a surface equivalent to that surface.

2. A method of manufacturing a semiconductor device having a nitride-based hetero-structure mainly composed of InN or an InN-based compound comprising a step of forming, in the device, crystal having, at least partly, a nitrogen polarity surface or a surface equivalent to that surface.

* * * * *